United States Patent
Udagawa

(10) Patent No.: US 7,781,866 B2
(45) Date of Patent: Aug. 24, 2010

(54) GALLIUM NITRIDE-BASED SEMICONDUCTOR STACKED STRUCTURE, METHOD FOR FABRICATION THEREOF, GALLIUM NITRIDE-BASED SEMICONDUCTOR DEVICE AND LAMP USING THE DEVICE

(75) Inventor: Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 476 days.

(21) Appl. No.: 11/791,020

(22) PCT Filed: Nov. 15, 2005

(86) PCT No.: PCT/JP2005/021327

§ 371 (c)(1),
(2), (4) Date: Aug. 14, 2007

(87) PCT Pub. No.: WO2006/054737

PCT Pub. Date: May 26, 2006

(65) Prior Publication Data

US 2008/0135852 A1    Jun. 12, 2008

Related U.S. Application Data

(60) Provisional application No. 60/631,987, filed on Dec. 1, 2004.

(30) Foreign Application Priority Data

Nov. 18, 2004    (JP)    .............................. 2004-334517

(51) Int. Cl.
*H01L 29/30*    (2006.01)
*H01L 33/00*    (2006.01)
*H01L 21/00*    (2006.01)

(52) U.S. Cl. ........................ 257/617; 257/97; 257/103; 257/E33.043; 257/E33.049; 438/47

(58) Field of Classification Search ...................... None
See application file for complete search history.

(56) References Cited

U.S. PATENT DOCUMENTS 5,432,808 A    7/1995    Hatano et al.

(Continued)

FOREIGN PATENT DOCUMENTS

JP    2-288388    11/1990

(Continued)

OTHER PUBLICATIONS

Nouet et al. The Atomic Structure of Prismatic Planar Defects in GaN/AlN Grown over Silicon Carbide and Sapphire Substrates. 1998. Materials Science Forum vols. 264-268. pp. 1247-1250.*

(Continued)

*Primary Examiner*—Andy Huynh
*Assistant Examiner*—Hoang-Quan T Ho
(74) *Attorney, Agent, or Firm*—Sughrue Mion, PLLC

(57) ABSTRACT

A gallium nitride-based semiconductor stacked structure includes a single crystal substrate, a low-temperature buffer layer grown at a low temperature in a region contiguous to the single crystal substrate and a gallium nitride-based semiconductor layer overlying the low-temperature buffer layer. The low-temperature buffer layer possesses therein a single crystal layer formed of a hexagonal $Al_xGa_yN$-based Group III nitride material containing gallium predominantly over aluminum, wherein $0.5 < \gamma \leq 1$ and $X+\gamma=1$. The single crystal layer has crystal defects at a smaller density on a (10-10) crystal face than on a (11-20) crystal face. A method for production of the gallium nitride-based semiconductor stacked structure is also disclosed.

11 Claims, 3 Drawing Sheets

U.S. PATENT DOCUMENTS

| | | | |
|---|---|---|---|
| 6,163,557 | A * | 12/2000 | Dunnrowicz et al. ..... 372/46.01 |
| 6,252,261 | B1 | 6/2001 | Usui et al. |

FOREIGN PATENT DOCUMENTS

| | | | |
|---|---|---|---|
| JP | 6-326416 | A | 11/1994 |
| JP | 7-288231 | | 10/1995 |
| JP | 8-255926 | | 10/1996 |
| JP | 10-022224 | * | 1/1998 |
| JP | 10-22224 | A | 1/1998 |
| JP | 10-097994 | * | 4/1998 |
| JP | 10-97994 | A | 4/1998 |
| JP | 11-4018 | A | 1/1999 |
| JP | 2000-174342 | A | 6/2000 |
| JP | 2000-349338 | A | 12/2000 |
| JP | 2004-88131 | A | 3/2004 |

OTHER PUBLICATIONS

G. Nouet et al., "The Atomic Structure of Prismatic Planar Defects in GaN/AlN Grown ocer Silicon Carbide and Sapphire Substrates.", Materials Science Forum, 1998, p. 1247-1250, vols. 264-268.

John E. Northrup et al., "Theory of GaN(1010) and (1120) surfaces.", Physical Review B, Apr. 15, 1996, vol. 53, No. 16.

Kazumasa Hiramatsu et al.; "Mechanism of Heteroepitaxy of GaN Grown on Sapphire Substrate"; Oct. 29, 1993; pp. 354.

Isamu Akasaki; "Advanced Electronics Series 1-1, Category I: Electronic Material, Physical Characteristic, Device; Group III-V compound semiconductor"; Baifukan Co., Ltd.; Chapter 13, pp. 329-351.

"Why GaN is noticed"; Mar. 1991; pp. 63-66.

"GaN blue light/ultraviolet light emitting element"; Solid State Physics; vol. 25, No. 6, 1990; pp. 399-405.

H. Amano, et al.; UV and blue electroluminescence from Al/GaN:Mg/GaN LED treated with low-energy electron beam irradiation (LEEBI); Gallium Arsenide and Related Compounds 1989; Sixteenth International Symposium on Gallium Arsenide and Related Compounds; Sep. 1989; Institute of Physics Conference Series No. 106; Chapter 10; pp. 725-730.

"Trend of Blue LED"; Toyoda Gosei; vol. 31, No. 2; Aug. 20, 1989; pp. 85-93.

Isamu Akasaki et al.; "Effects of AlN Buffer Layer on Crystallographic Structure and on Electrical and Optical Properties of GaN and $Ga_{1-x}Al_xN$ ($0 < x \leq 0.4$) Films Grown on Sapphire Substrate by MOVPE"; Journal of Crystal Growth 98 (1989); pp. 209-219.

"Physical Science Dictionary"; pp. 776-778; Baifukan Co., Ltd.; Oct. 20, 1986.

* cited by examiner

GALLIUM NITRIDE-BASED SEMICONDUCTOR STACKED STRUCTURE, METHOD FOR FABRICATION THEREOF, GALLIUM NITRIDE-BASED SEMICONDUCTOR DEVICE AND LAMP USING THE DEVICE

CROSS REFERENCE TO RELATED APPLICATIONS

This application is an application filed under 35 U.S.C. §111(a) claiming the benefit pursuant to 35 U.S.C. §119(e)(1) of the filing dates of Provisional Application No. 60/631,987 filed Dec. 1, 2004 and Japanese Applications No. 2004-334517 filed Nov. 18, 2004 pursuant to 35 U.S.C. §111(b).

TECHNICAL FIELD

This invention relates to a gallium nitride-based semiconductor stacked structure provided with a low-temperature buffer layer formed of a Group III nitride semiconductor, a method for the fabrication thereof, a gallium nitride-based semiconductor device and a lamp using the device.

BACKGROUND ART

The gallium nitride (GaN)-based Group III-V compound semiconductors of the cubic zinc blende crystal or the hexagonal wurtzite crystal have been heretofore utilized for fabricating short wavelength visible light-emitting devices, for example (refer, for example, to JP-A HEI 2-288388). The stacked structures used for the fabrication of gallium nitride-based semiconductor devices have been manufactured by using single crystals of aluminum oxides having high thermal resistance, such as a solid-state single crystal of sapphire ($\alpha$-$Al_2O_3$ single crystal) or garnet, as a substrate (refer, for example, to JP-A HEI 7-288231).

However, the single crystal substrates formed of aluminum oxides, such as sapphire, and the gallium nitride (GaN)-based semiconductor materials have profoundly different lattice constants. The lattice mismatch factor between sapphire and hexagonal GaN, for example, is as large as 13.8% (refer, for example, to Kazumasa HIRAMATSU (et al.), "Journal of Japanese Association for Crystal Growth," Vol. 20, No. 4, 1993 (Japan), pp. 28-36). Thus, the stacked structures used for fabricating gallium nitride-based semiconductor devices are generally formed on their substrates through a buffer layer deposited thereon. The buffer layers aimed at relaxing lattice mismatch have been heretofore formed at a comparatively low temperature and, therefore, are called low-temperature buffer layers (refer, for example, to Isamu AKASAKI, "Group III-V Compound Semiconductors," published on May 20, 1995, by Baifukan K. K., first edition, Chapter 13).

The low-temperature buffer layers are formed of gallium nitride, for example (refer, for example, to JP-A HEI 8-255926). It is held that these low-temperature buffer layers are preferably formed of an amorphous or polycrystalline material in an as-grown state for the sake of relaxing the lattice mismatch with the crystals of the substrate (refer, for example, to JP-A HEI 8-255926). In fact, the p-n junction-type blue LED provided with a light-emitting layer formed of gallium nitride and making use of a low-temperature buffer layer of aluminum nitride (AlN) having such a structure has been reduced to practice (refer, for example, to "Electronics," March 1991 issue, pp. 63-66). Further, the fact that the low-temperature buffer layers of this structure are utilized in short wavelength LED products emitting a blue color band light and an ultraviolet band light has been disclosed in early publications, such as Hiroshi AMANO and Isamu AKASAKI, "Solid Physics," Vol. 25, No. 6, 1990 (Japan), pp. 35-41 and H. AMANO (et al.), Institute of Physics Conference Series, Vol. 106, Chapter 10, 1990 (England), pp. 725-730. This fact pertaining to MIS-type blue LED products has been disclosed in earlier publications, such as Masahide MABE, "TOYODA GOSEI TECHNICAL REVIEW," Vol. 31, No. 2, 1989 (Japan), pp. 85-93 (particularly FIG. 1 in the left column, page 87 and lines 5-6 from the top of the left column).

When the low-temperature buffer layer constitutes itself an under layer, it is regarded as exhibiting superiority in forming thereon a semiconductor layer of a Group III nitride, such as GaN, which excels in continuity at a temperature higher than the temperature used for growing the low-temperature buffer layer. This superiority is interpreted as caused by the presence of the low-temperature buffer layer, which promotes the growth in the lateral (horizontal) direction of the single crystal grains of the Group III nitride semiconductor occurring on the surface thereof and consequently allows smooth advance of the cohesion of the Group III nitride semiconductor single crystal grains prevalently developing in the horizontal direction (refer, for example, to Isamu AKASAKI, Hiroshi AMANO, Yasuo KOIDE, Kazumasa HIRAMATSU and Nobuhiko SAWAKI, Journal of Crystal Growth, Vol. 98, 1989 (The Netherlands), pp. 209-219). The mutual cohesion of the Group III nitride semiconductor single crystal grains which induces the continuity, when the single crystal grains are hexagonal, can occur in the (10-10) plane in the Miller≡Bravais index and the face crystallographically equivalent thereto.

For example, in the low-temperature buffer layer formed of a Group III nitride semiconductor on the sapphire with a (0001) surface (so-called C surface) using a substrate, the Group III nitride semiconductor low-temperature buffer layer having a single crystal layer formed of a Group III nitride semiconductor, such as of $Al_2Ga_yN$ in the junction region with the substrate, has been demonstrated to be effective in inducing a gallium nitride-based semiconductor layer oriented uniformly in a specific crystal direction (refer, for example, to JP-A-HEI-10-022224).

Besides the uniform orientation, the structural requirements which the low-temperature buffer layer formed of a Group III nitride semiconductor ought to fulfill for the purpose of inducing as the upper layer a gallium nitride-based semiconductor layer suffering crystal defects, such as stacking faults, only at a low density and excelling in single crystallinity have not been satisfactorily elucidated. Thus, the conventional low-temperature buffer layers, notwithstanding their uniform orientation, still constitute themselves under layers which fall short of inducing fully stably a gallium nitride-based semiconductor layer suffering crystal defects only in a sufficiently low density and excelling in crystallinity as an upper layer.

This invention has been initiated with a view to overcoming the problems encountered by the prior art as described above and is aimed at providing a gallium nitride-based semiconductor stacked structure provided with a buffer layer as an under layer (substratum) capable of fully stably inducing a gallium nitride-based semiconductor stacked structure to acquire uniform orientation, suffer crystal defects at a fully lowered density and excel in crystallinity, a method for the production thereof, and gallium nitride-based semiconductor device and lamp.

DISCLOSURE OF THE INVENTION

With a view to accomplishing the object mentioned above, a first aspect of this invention is directed toward a gallium nitride-based semiconductor stacked structure comprising a single crystal substrate, a low-temperature buffer layer grown at a low temperature in a region contiguous to the single crystal substrate and a gallium nitride (GaN)-based semiconductor layer overlying the low-temperature buffer layer, wherein the low-temperature buffer layer possesses therein a single crystal layer formed of a hexagonal $Al_xGa_yN$ ($0.5<\gamma\leq1$, $X+\gamma=1$)-based Group III nitride material containing gallium (Ga) predominantly over aluminum (Al) and the single crystal layer has crystal defects at a smaller density on a (10-10) crystal face than on a (11-20) crystal face.

A second aspect of this invention is directed toward the stacked structure of the first aspect, wherein the single crystal substrate is a sapphire (α-alumina single crystal) substrate having a {0001} plane (C plane) surface.

A third aspect of this invention is directed toward the stacked structure of the first aspect, wherein the single crystal substrate is a silicon carbide substrate having a {0001} plane (C plane) surface.

A fourth aspect of this invention is directed toward the stacked structure of any one of the first to third aspects, wherein the gallium nitride-based semiconductor layer has a [10-10] direction thereof laid in parallel to a [10-10] direction of the single crystal layer of the low-temperature buffer layer.

A fifth aspect of this invention is directed toward the stacked structure of any one of the first to fourth aspects, wherein the single crystal layer of the low-temperature buffer layer has crystal defects on a (10-10) crystal face at a density of ⅕ or less of a density of crystal defects on a (11-20) crystal face.

A sixth aspect of this invention is directed toward a method for the production of a gallium nitride-based semiconductor stacked structure comprising the steps of forming on a single crystal substrate a low-temperature buffer layer grown at a low temperature falling in a range of 250° C. to 500° C., forming a gallium nitride-based semiconductor layer on the low-temperature buffer layer, and forming in the low-temperature buffer layer a single crystal layer made of a hexagonal $Al_xGa_yN$ ($0.5<\gamma\leq1$, $X+\gamma=1$)-based Group III nitride material containing gallium predominantly over aluminum by causing a gallium raw material to reach a first surface of the substrate before an aluminum raw material, wherein the single crystal layer has crystal defects on a (10-10) crystal face at a lower density than on a (11-20) crystal face.

A seventh aspect of this invention is directed toward the method of the sixth aspect, wherein the single crystal substrate is a sapphire (α-alumina single crystal) substrate having the {0001} face (C plane) surface thereof.

An eighth aspect of this invention is directed toward the method of the sixth aspect, wherein the single crystal substrate is a silicon carbon substrate having a {0001} face (C plane surface thereof.

A ninth aspect of this invention is directed toward the method of any one of the sixth to eighth aspects, wherein the low-temperature buffer layer is grown at a growth rate in a range of 1 to 3 nm/min.

A tenth aspect of this invention is directed toward a gallium nitride-based semiconductor device using the gallium nitride-based semiconductor stacked structure of any one of the first to fifth aspects.

An eleventh aspect of this invention is directed toward a lamp using the gallium nitride-based semiconductor device of the tenth aspect.

According to this invention, since the low-temperature buffer layer is provided in the interior thereof with a single crystal layer formed of a hexagonal $Al_xGa_yN$-based Group III nitride material containing gallium predominantly over aluminum and the single crystal layer has crystal defects on the (10-10) crystal face at a lower density than the density of crystal defects on the other crystal faces, particularly on the (11-20) crystal face and the crystal faces equivalent thereto, the gallium nitride-based semiconductor layer to be formed as a superstructure is enabled to excel in continuity and exhibit sufficient stability by suppressing crystal defects particularly in the [10-10] direction.

Further, since the gallium nitride-based semiconductor layer has the [10-10] direction thereof lain in parallel with the [10-10] direction of the low-temperature buffer layer, it is made possible to decrease the crystal defects on the (10-10) crystal face to a great extent and give rise to a gallium nitride-based semiconductor light-emitting device excelling in characteristic properties.

Since the gallium nitride-based semiconductor device is formed by using the gallium nitride-based semiconductor stacked structure of this invention, it is made possible to give rise to a gallium nitride-based semiconductor device, such as a light emitting diode, which betrays inferior breakdown voltage meagerly in the reverse direction, for example and excels in breakdown characteristic properties.

BEST MODE FOR CARRYING OUT THE INVENTION

Figure 1:
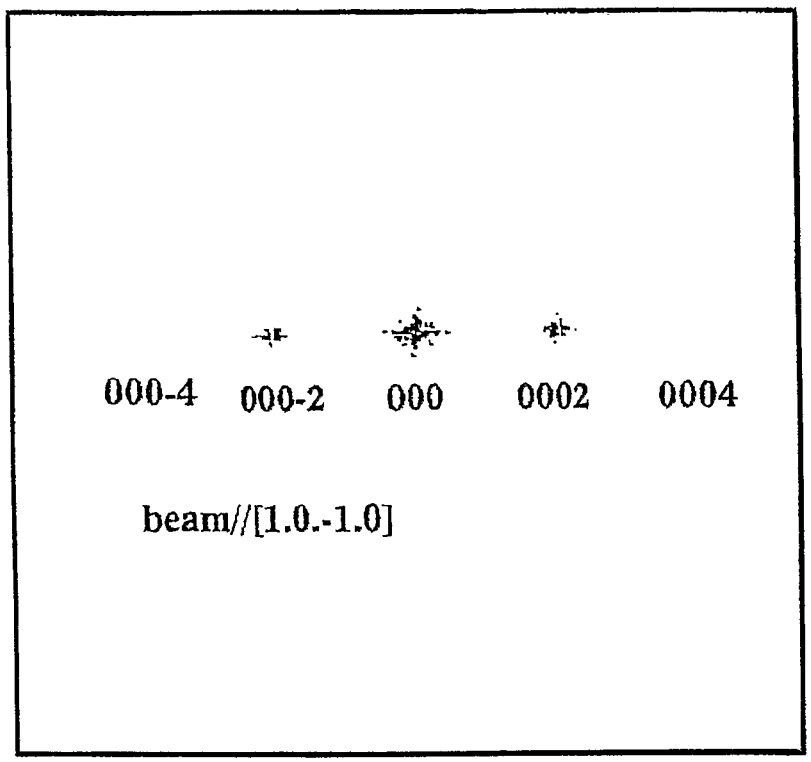
FIG. 1 is a diagram showing an electron beam diffraction pattern of a single crystal layer in a low-temperature buffer layer taken in the [10-10] direction.

The gallium nitride-based semiconductor stacked structure of this invention comprises at least a substrate, a low-temperature buffer layer on the substrate and a gallium nitride-based semiconductor layer on the low-temperature buffer layer.

The low-temperature buffer layer possesses in the interior thereof a single crystal layer formed of a hexagonal $Al_xGa_yN$ ($0.5<\gamma\leq1$, $X+\gamma=1$)-based Group III nitride material containing gallium (Ga) predominantly over aluminum (Al) and is formed as by means of metal-organic chemical vapor deposition (MOCVD) on the (0001) crystal face (the so-called C plane) of sapphire forming the substrate. To effect this formation by the MOCVD means, trimethyl gallium ($(CH_3)_3Ga$) or triethyl gallium ($(C_2H_5)_3Ga$) is used as a gallium (Ga) source and a metal-organic (MO) compound, such as trimethyl aluminum (($(CH_3)_3$Al) or triisobutyl aluminum ((i-$C_4H_9)_3$Al), is used as an aluminum (Al) source. As a nitrogen source, ammonia ($NH_3$) and hydrazine ($N_2H_4$) are available. Dimethyl hydrazines (($CH_3)_2H_2N_2$) of the asymmetric molecular structure having lower temperatures of thermal decomposition are also usable as the raw material for the nitrogen (N) used for the growth of an $Al_XGa_YN$ low-temperature buffer layer.

For the purpose of forming the $Al_XGa_YN$ low-temperature buffer layer provided on the first surface, particularly the (0001) face (C plane), of the sapphire substrate in the region contiguous to the substrate with the hexagonal $Al_XGa_YN$ ($0.5<\gamma\leq1$, $X+\gamma=1$) single crystal layer, the growth temperature is preferred to be 250° C. or more and 500° C. or less. If the temperature falls below 250° C., a lower temperature will result in preventing a single crystal of $Al_XGa_YN$ from being formed fully stably inside the $Al_XGa_YN$ low-temperature buffer layer in the part contiguous to the sapphire substrate because of the insufficient thermal decomposition of the raw material for the growth. If the temperature exceeds 500° C., the overage will result in suffering columnar crystals of $Al_XGa_YN$ to rise randomly and even worse occur mutually in isolation and consequently preventing the (0001) face of the sapphire substrate from being uniformly and sufficiently coated. Thus, the $Al_XGa_YN$ low-temperature buffer layer provided with an $Al_XGa_YN$ ($0.5<\gamma\leq1$, $X+\gamma=1$) single crystal layer formed by continuous connection of $Al_XGa_YN$ single crystals is hindered from being stably obtained. The growth temperature of the $Al_XGa_YN$ low-temperature buffer layer possessed of continuity as contemplated by this invention is preferably 350° C. or more and 450° C. or less.

When the $Al_XGa_YN$ low-temperature buffer layer is grown at a temperature within the preferable range mentioned above while the gallium raw material is enabled to reach the (0001) face of the sapphire substrate temporally before the aluminum raw material, the $Al_XGa_YN$ ($0.5<\gamma\leq1$, $X+\gamma=1$) single crystal layer having the [10-10] direction thereof uniformly oriented in parallel with the [21-10] direction of sapphire can be stably formed as adjoined to the C plane of the sapphire substrate. When the inflow of the Al raw material, such as trimethyl aluminum, is effected in five seconds to five minutes of feeding the Ga raw material, such as trimethyl gallium, to the first surface of the sapphire substrate, this procedure manifests an effect in stably forming the low-temperature buffer layer provided with the $Al_XGa_YN$ ($0.5<\gamma\leq1$, $X+\gamma=1$) single crystal layer containing Ga more abundantly than Al. When the temperature for growing the $Al_XGa_YN$ low-temperature buffer layer is set at a temperature as high as possible within the preferable temperature range mentioned above, the temporal interval between the time for feeding the Ga raw material and the time for feeding the Al raw material is preferred to be shortened. This is for the purpose of preventing the Ga raw material adhering to the first surface of the sapphire substrate from volatilizing and consequently enabling the produced $Al_XGa_YN$ single crystal layer to coat the first surface of the substrate homogeneously. When the $Al_XGa_YN$ low-temperature buffer layer is grown at 450° C., for example, the feed of the Al raw material is preferred to be started within two minutes of feeding the Ga raw material.

Conversely, when the aluminum raw material is made to reach the first surface of the sapphire substrate before the gallium raw material, the $Al_XGa_YN$ ($0.5<\gamma\leq1$, $X+\gamma=1$) single crystal layer having the [10-10] direction thereof oriented in parallel with the [21-10] direction of sapphire cannot be stably formed, though gallium is contained more abundantly than aluminum. This procedure possibly results in forming a polycrystalline layer having nonuniform orientation which, in spite of having the (0001) face, contains a hexagonal $Al_XGa_YN$ ($0.5<\gamma\leq1$, $X+\gamma=1$) having the [21-10] direction thereof oriented in parallel with the [21-10] direction of sapphire. The $Al_XGa_YN$ low-temperature buffer layer provided with the $Al_XGa_YN$ ($0.5<\gamma\leq1$, $X+\gamma=1$) single crystal layer having the [21-10] direction thereof oriented in parallel with the [21-10] direction of the sapphire of the substrate does not prove sufficiently effective in stably inducing a superstructure having crystal defects only at a low density and excelling in crystallinity.

When the $Al_XGa_YN$ low-temperature buffer layer is grown at a growth rate in the range from 1 nanometer (nm) or more per minute to 3 nm or less per minute under the conditions satisfying the preferred temperature range and the means of supply of the Group III component element mentioned above, it is made possible to form a low-temperature buffer layer which is provided in the regions thereof contiguous to the sapphire substrate with a $Al_XGa_YN$ ($0.5<\gamma\leq1$, $X+\gamma=1$) single crystal layer having crystal defects at a low density on the (10-10) face and the crystal face equivalent thereto.

The density of the crystal defects on the (10-10) face and the crystal face equivalent thereto of the $Al_XGa_YN$ ($0.5<\gamma\leq1$, $X+\gamma=1$) single crystal layer formed by this invention is ⅕ or less of the density of crystal defects, such as twins and stacking faults, on other crystal face, such as the (11-20) crystal face. Particularly, the density of stacking faults is less than about $1\times10^5$ $cm^2$. In other words, the $Al_XGa_YN$ ($0.5<\gamma\leq1$, $X+\gamma=1$) single crystal layer which can be produced has crystal defects at a lower density in the [10-10] direction than in the [11-20] direction.

The question whether or not the $Al_XGa_YN$ ($0.5<\gamma\leq1$, $X+\gamma=1$) layer contained in the region contiguous to the sapphire substrate can be judged from the electron beam diffraction pattern. The layer is amorphous when the diffraction pattern is a halo. It is polycrystalline when the diffraction appears in the form of a ring. It is a single crystal when the electron beam diffraction pattern shows neither a halo nor a diffraction ring and shows diffraction points resembling spots. This invention regards a sample which shows linear streaks accompanied by diffraction spots (refer to "Physics Dictionary, Reduced-Size Edition," complied and written by Physics Dictionary Edition Committee, (published on Oct. 20, 1986 by Baifukan K. K., first edition), pp 776-777) as a single crystal layer containing crystal defects, such as stacking faults.

The orientation of the $Al_XGa_YN$ ($0.5<\gamma\leq1$, $X+\gamma=1$) single crystal layer which is provided in the $Al_XGa_YN$ low-temperature buffer layer can be investigated by utilizing the method of electron beam diffraction. Let us assume that an electron beam diffraction pattern of the $Al_XGa_YN$ ($0.5<\gamma\leq1$, $X+\gamma=1$) single crystal layer is picked up by injecting an electron beam in parallel with the [21-10] direction of sapphire forming the substrate. When the electron beam diffraction pattern shows an inverted lattice image of the $Al_XGa_YN$ single crystal in the bird's eye view from the [10-10] direction, the $Al_XGa_YN$ single crystal layer can be judged as having the [10-10] direction thereof oriented in parallel with the [21-10] direction of sapphire.

The presence of crystal defects, such as stacking faults and twins, which are contained in the $Al_XGa_YN$ ($0.5<\gamma\leq1$, $X+\gamma=1$) single crystal layer can be discerned as by the appearance of linear streaks and abnormal diffraction spots in the electron beam diffraction pattern. The presence of stacking faults in the low-temperature buffer layer is known from the appearance of streaks. For example, the electron beam diffraction pattern of a $Al_XGa_YN$ single crystal layer in a low-temperature buffer layer contemplated by this invention, which was picked up by injecting an electron beam in parallel to the [10-10] direction is illustrated in FIG. 1. FIG. 1 is an electron beam diffraction pattern picked up from the (10-10) face. The pattern shows only diffractions shaped like spots, such as (0002) and (0004), and does not show any streak. Thus, it is known that the $Al_XGa_\gamma N$ ($0.5<\gamma\leq1$, $X+\gamma=1$) single crystal layer according to this invention has crystal defects, such as stacking faults, at a low density on the (10-10) face.

Figure 2:
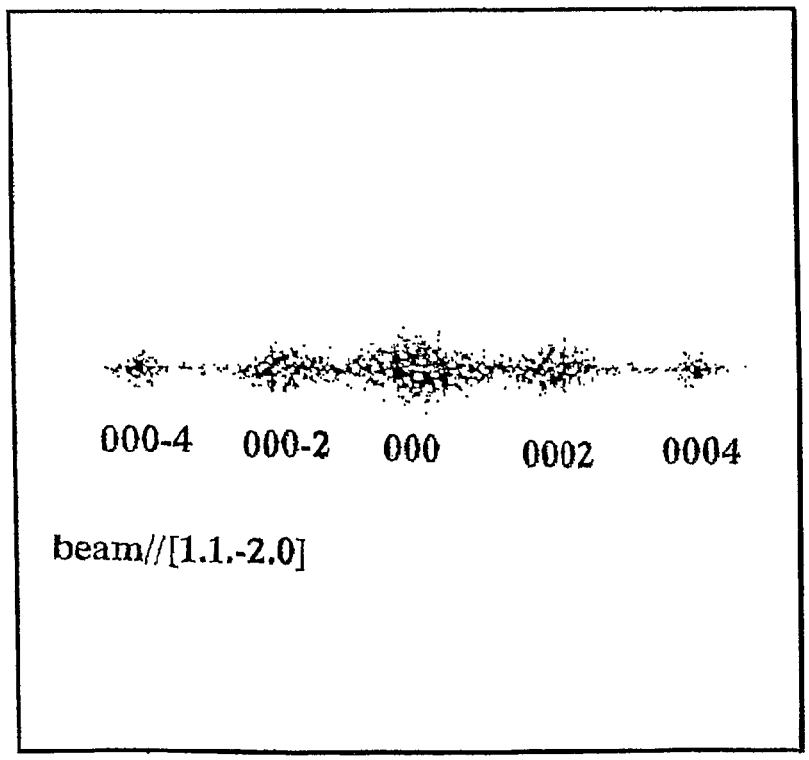
FIG. 2 is a diagram showing an electron beam diffraction pattern of a single crystal layer in a low-temperature buffer layer taken in the [11-20] direction.

The electron beam diffraction pattern of the same $Al_XGa_\gamma N$ single crystal layer picked up by changing the direction of injection of the electron beam to the [11-20] direction is shown in FIG. 2. This electron beam diffraction pattern shows linear streaks indicating the presence of stacking faults. When stacking faults are present in a high density, it is considered that the intensity of streaks is enhanced (refer to the aforementioned "Physics Dictionary, Reduced-Size Edition," pp. 776-777). The electron beam diffraction pattern of FIG. 2 picked up from the (11-20) face shows streaks that appear as though they were connecting diffraction spots. This pattern vividly indicates that the (11-20) face of the $Al_XGa_\gamma N$ single crystal layer contains crystal defects, such as stacking faults, in a larger amount than the (10-10) face inside the layer. In other words, the pattern indicates that the [11-20] direction of the $Al_XGa_\gamma N$ single crystal layer of this invention contains crystal defects in a larger amount than the [10-10] direction.

The thickness of the $Al_XGa_\gamma N$ ($0.5<\gamma\leq1$, $X+\gamma=1$) single crystal layer is increased in accordance as the growth temperature of the $Al_XGa_\gamma N$ low-temperature buffer layer is heightened. When the $Al_XGa_\gamma N$ low-temperature buffer layer of a small thickness is grown at a high temperature, therefore, the $Al_XGa_\gamma N$ ($0.5<\gamma\leq1$, $X+\gamma=1$) single crystal layer will possibly occupy not only the region contiguous to the sapphire substrate but also the whole of the low-temperature buffer layer. In this case, the thickness of the $Al_XGa_\gamma N$ ($0.5<\gamma\leq1$, $X+\gamma=1$) single crystal layer amounts to the total thickness of the $Al_XGa_\gamma N$ low-temperature buffer layer. Conversely, when the $Al_XGa_\gamma N$ low-temperature buffer layer of a large thickness is grown at a low temperature, it will possibly be composed of an $Al_XGa_\gamma N$ ($0.5<\gamma\leq1$, $X+\gamma=1$) single crystal layer contiguous to the sapphire substrate and an amorphous body deposited on the single crystal layer. This may be explained by an inference that the power of influence due to the regular atomic arrangement on the first surface of the sapphire substrate is enervated in accordance as the thickness of the $Al_XGa_\gamma N$ low-temperature buffer layer is increased and consequently the first surface is not enabled to grow into a single crystal. In this case, the thickness of the $Al_XGa_\gamma N$ ($0.5<\gamma\leq1$, $X+\gamma=1$) single crystal layer and the thickness of the amorphous body amount to the total thickness of the $Al_XGa_\gamma N$ low-temperature buffer layer. In either of the cases mentioned above, the total thickness of the $Al_XGa_\gamma N$ low-temperature buffer layer is preferred to be 1 nm or more and 50 nm or less.

The thickness of the $Al_XGa_\gamma N$ ($0.5<\gamma\leq1$, $X+\gamma=1$) single crystal layer which is formed in the region contiguous to the sapphire substrate proves sufficient so long as it is 1 nm or more. In the single crystal of $Al_XGa_\gamma N$, the aluminum, gallium and nitrogen atoms are mutually bound strongly. The $Al_XGa_\gamma N$ ($0.5<\gamma\leq1$, $X+\gamma=1$) single crystal layer according to this invention, therefore, continues keeping the first surface of the sapphire substrate coated intact even when it is exposed to an elevated temperature exceeding 800° C. or 1,000° C., for example, for the purpose of forming a GaN-based semiconductor layer on the $Al_XGa_\gamma N$ low-temperature buffer layer. Thus, the sapphire substrate is enabled to avoid directly contacting the GaN-based semiconductor layer which generally has a large lattice mismatch with sapphire. The sapphire substrate, therefore, functions effectively as a buffer layer for relaxing the lattice mismatch between sapphire and the GaN-based semiconductor layer and allowing formation of the GaN-based semiconductor layer excelling in crystallinity as a superstructure.

The amorphous body possibly occurs in an as-grown state on the $Al_XGa_\gamma N$ ($0.5<\gamma\leq1$, $X+\gamma=1$) single crystal layer as described above. Part of the amorphous body is found to be crystallized as on the $Al_XGa_\gamma N$ low-temperature buffer layer during the process for growing the GaN-based semiconductor layer at a high temperature. In this while, the $Al_XGa_\gamma N$ ($0.5<\gamma\leq1$, $X+\gamma=1$) single crystal layer as an under layer manifests an effect of transforming the amorphous body into a crystal of perfect orientation. If the amorphous layer on the $Al_XGa_\gamma N$ ($0.5<\gamma\leq1$, $X+\gamma=1$) single crystal layer has an unduly large thickness, however, while the amorphous body existing in the neighborhood of the first surface of the $Al_XGa_\gamma N$ ($0.5<\gamma\leq1$, $X+\gamma=1$) single crystal layer is crystallized, the amorphous body existing at a farther distance may possibly fail to undergo crystallization. Thus, the amorphous layer encounters difficulty in being stably crystallized throughout the entire region thereof. Thus, the thickness of the amorphous body on the $Al_XGa_\gamma N$ ($0.5<\gamma\leq1$, $X+\gamma=1$) single crystal layer proves proper when it falls short of 15 nm. The fact that the thickness of the amorphous body is zero (0) means that no amorphous body exists on the $Al_XGa_\gamma N$ ($0.5<\gamma\leq1$, $X+\gamma=1$) single crystal layer and the surface of the single crystal layer is exposed to the ambience. The exposure of the surface of the $Al_XGa_\gamma N$ ($0.5<\gamma\leq1$, $X+\gamma=1$) single crystal layer throughout the entire area proves advantageous for the sake of enabling the GaN-based semiconductor layer of a single crystal to be formed thereon.

When the $Al_XGa_\gamma N$ low-temperature buffer layer according to this invention constitutes itself an under layer, the GaN-based semiconductor layer formed thereon is enabled to suppress the occurrence of crystal defects, such as stacking faults. It is particularly made possible to form the GaN-based semiconductor layer of high quality in a hexagonal structure developed as a continuous film in the mode of growth repeating cohesion on the (10-10) face. The material of the substrate does not need to be limited to sapphire. Even the GaN-based semiconductor layer grown by repeating cohesion on the (0001) face of a substrate formed of a hexagonal crystal having a (0001) surface that is silicon carbide (SiC) crystal, for example, is enabled to acquire excellent crystallinity when the $Al_XGa_\gamma N$ low-temperature buffer layer contemplated by this invention is used as an under layer. This fact suggests that by equalizing the crystal face of the $Al_XGa_\gamma N$ ($0.5<\gamma\leq1$, $X+\gamma=1$) single crystal layer having crystal defects at a lower density than the other crystal faces with the cohering face occurring during the development of the GaN-based semiconductor layer, it is made possible to enable the GaN-based semiconductor layer to suppress the generation of crystal defects.

The $Al_XGa_\gamma N$ low-temperature buffer layer of this invention, during the growth of the Group III nitride semiconductor layer through the process of cohesion, is capable of potentially preventing the crystal defects on the (10-10) face, i.e. the cohering face thereof, from increasing and, therefore, is capable of excellently forming an n-type or p-type conducting GaN-based semiconductor layer. Further, since the $Al_XGa_\gamma N$ low-temperature buffer layer of this invention has crystal defects only in a small amount thereon, the GaN-based semiconductor layer to be formed is enabled to acquire high resistance enough to preclude the occurrence of an unnecessary leak current through crystal defects. By thus making use of the GaN-based semiconductor layer excelling in crystallinity, it is made possible to fabricate a gallium nitride-based stacked structure excelling in electrical properties and befitting light-emitting devices.

The GaN-based semiconductor layer to be disposed on the $Al_XGa_YN$ low-temperature buffer layer can be formed by the halogen method, the hydride method and the vapor phase growth method, such as the MOCVD method. It can be formed by the molecular bean epitaxy method as well. For example, by forming a light-emitting device of a p-n junction-type double hetero (DH) structure made of a GaN-based semiconductor material on the $Al_XGa_YN$ low-temperature buffer layer, it is made possible to give rise to a gallium nitride-based semiconductor stacked structure used for the fabrication of a light-emitting device, such as a laser diode (LD) which emits a short wavelength visible light.

Further, in the formation of a stacked structure for use in a light-emitting device, such as an LED or LD, the configuration having a GaN-based semiconductor thin layer containing indium (In) or aluminum (Al) or a superlattice structure layer containing the thin layer inserted between the $Al_XGa_YN$ low-temperature buffer layer according to this invention and a light-emitting layer (active layer) manifests an effect in producing a light-emitting layer revealing a misfit dislocation only sparingly and excelling in crystallinity. For example, on the GaN layer formed on the $Al_XGa_YN$ low-temperature buffer layer, the light-emitting layer is deposited through a thin layer made of $Al_QGa_{1-Q}N$ ($0<Q\leq1$). Alternatively, a superlattice structure layer containing an n-type gallium indium nitride ($Ga_QIn_{1-Q}N$; $0<Q\leq1$) is inserted between a low-temperature buffer layer and an n-type light-emitting layer, and a light-emitting layer is formed thereon. The use of a gallium nitride-based semiconductor stacked structure which is provided with a light-emitting layer inducing emission of high intensity proves excellent in configuring and fabricating an LED of high luminance. Since the gallium nitride-based semiconductor device according to this invention acquires high luminance as described above, it is enabled by being combined with a specific fluorescent material to afford a white lamp suitable for lighting apparatus, for example.

The gallium nitride-based semiconductor device contemplated by this invention is fabricated by properly subjecting such a stacked structure as described above to a patterning or an etching and providing it as with Schottky electrodes or ohmic electrodes. For example, uppermost layers, such as the contact layer, current spreading layer or window layer in the stacked structure for use in light-emitting devices may be provided with an ohmic electrode of either polarity. The LED is fabricated by further forming an ohmic electrode of the other polarity on a Group III-V compound semiconductor layer on the $Al_XGa_YN$ low-temperature buffer layer.

This invention fulfills the following functions based on the configuration described above. Specifically, in the $Al_XGa_YN$ low-temperature buffer layer formed on a sapphire substrate having a (0001) face (C plane) surface thereof, the $Al_XGa_YN$ ($0.5<\gamma\leq1$, $X+\gamma=1$) single crystal layer formed in the region contiguous to the sapphire substrate, having the [10-10] direction oriented in parallel with the [21-10] direction of sapphire and suppressing the density of crystal defects on the (10-10) crystal face, fulfills the function of producing on the low-temperature buffer layer a GaN-based semiconductor layer having the orientation uniformly collected and revealing crystal defects only sparingly in the [10-10] direction.

The $Al_XGa_YN$ ($0.5<\gamma\leq1$, $X+\gamma=1$) single crystal layer which is oriented in a specific crystal direction of sapphire forming the substrate and is enabled to suppress the density of crystal defects on a specific crystal face retains the single crystal property thereof even during the deposition of a superstructure at a high temperature on the $Al_XGa_YN$ low-temperature buffer layer, persists on the surface of the sapphire substrate and fulfills the function of relaxing the mismatch between the sapphire substrate and the GaN-based semiconductor layer formed as an upper layer.

The $Al_XGa_YN$ ($0.5<\gamma\leq1$, $X+\gamma=1$) single crystal layer provided for the low-temperature buffer layer which is oriented in the aforementioned specific crystal direction and enabled to suppress the density of crystal defects on the specific crystal face with respect to the sapphire forming the substrate, when an amorphous body is present thereon, fulfills the function of transforming this amorphous body into a single crystal having the same orientation as the $Al_XGa_YN$ ($0.5<\gamma\leq1$, $X+\gamma=1$) single crystal layer.

EXAMPLE 1

This invention will be specifically described below by citing a case of forming a gallium nitride-based semiconductor stacked structure having a GaN-based semiconductor layer grown on a sapphire substrate through an $Al_XGa_YN$ low-temperature buffer layer.

Figure 3:
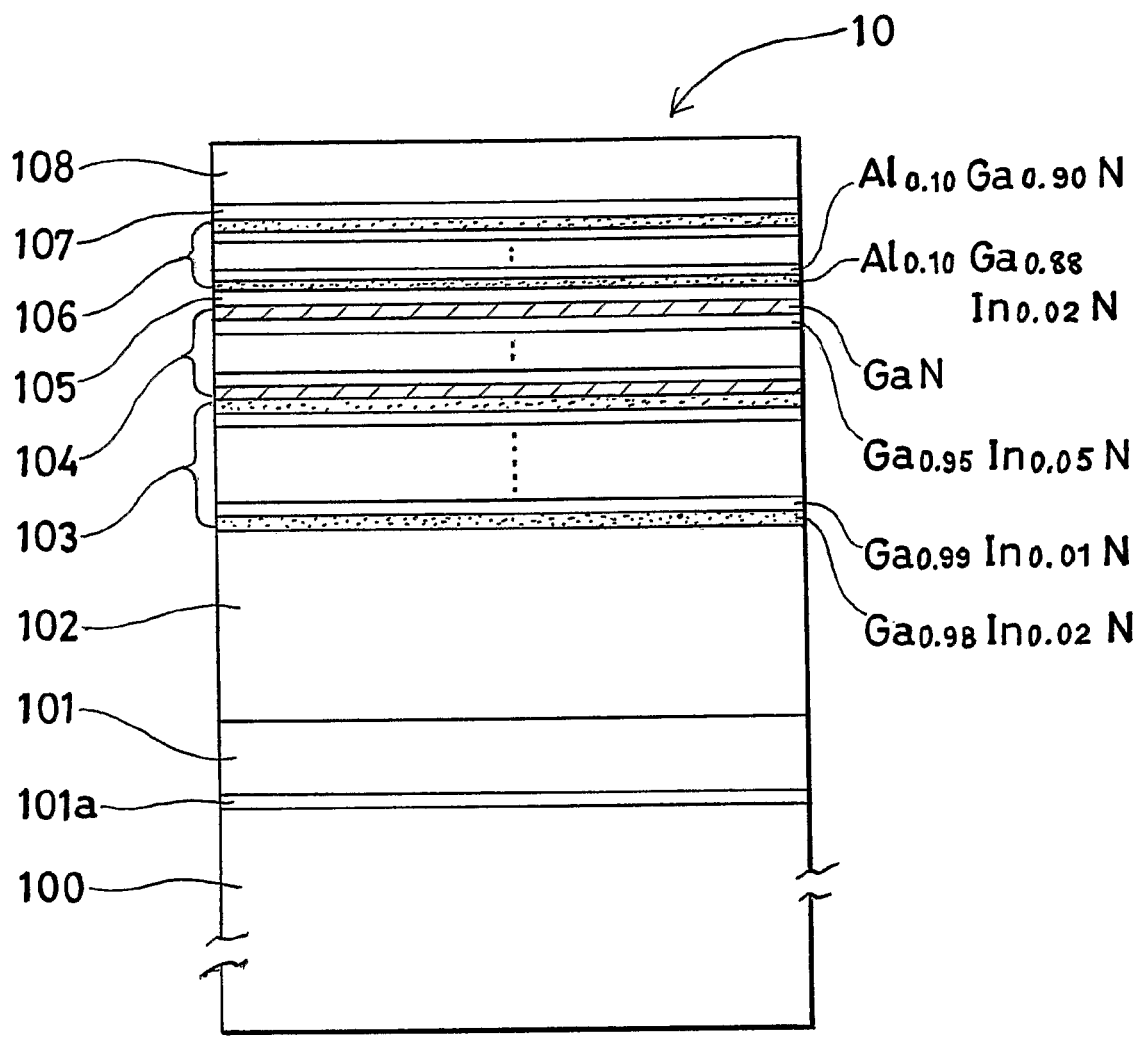
FIG. 3 is a schematic cross-sectional view illustrating the profile of a stacked structure described in Example 1.

The profile in cross section of a stacked structure 10 mentioned in Example 1 is schematically illustrated in FIG. 3.

Group III nitride semiconductor layers 102 to 110 provided for the stacked structure 10 were formed on the (0001) face of a sapphire substrate 100 through an aluminum gallium nitride mixed crystal ($Al_{0.10}Ga_{0.90}N$) low-temperature buffer layer 101. The low-temperature buffer layer 101 was grown at 400° C. by the normal pressure (approximating the atmospheric pressure) MOCVD technique using triethyl gallium (($C_2H_5$)$_3$Ga) as a gallium (Ga) source, trimethyl aluminum (($CH_3$)$_3$Al) as an aluminum (Al) source and ammonia ($NH_3$) as a nitrogen (N) source. The low-temperature buffer layer 101 was grown by causing the gallium source to reach the (0001) face of the sapphire substrate 100 temporally before the aluminum source. The growth rate was set at 3 nm per minute by adjusting the total of the concentrations of the ($C_2H_5$)$_3$Ga and ($CH_3$)$_3$Al supplied per unit time to the MOCVD reaction system. The thickness of the low-temperature buffer layer was set at 18 nm.

The crystal structure in the low-temperature buffer layer 101 in the as-grown state was analyzed by the electron beam diffraction technique. Since a diffraction pattern of the shape of spots was obtained from a region of a thickness of about 8 nm from the (0001) face of the sapphire substrate 100, it was concluded that an $Al_{0.10}Ga_{0.90}N$ single crystal layer 101a was present in the region of the $Al_{0.10}Ga_{0.90}N$ low-temperature buffer layer contiguous to the sapphire substrate 100. From the electron beam diffraction pattern, the $Al_{0.10}Ga_{0.90}N$ single crystal layer 101a was found to be formed of a hexagonal crystal having (0001) faces piled up in parallel on the (0001) face of sapphire. From the relation with the direction of injection of the electron beam, the $Al_{0.10}Ga_{0.90}N$ single crystal layer 101a was found to have the [10-10] direction thereof laid in parallel with the 21-10] direction of the sapphire forming the substrate 100. The thickness of the $Al_{0.10}Ga_{0.90}N$ single crystal layer was about 2 nm. On the surface of the $Al_{0.10}Ga_{0.90}N$ single crystal layer 101a, an amorphous body was scattered in a thickness of about 10 nm. Thus, the total thickness of the $Al_{0.10}Ga_{0.90}N$ low-temperature buffer layer 101 in the as-grown state was about 12 nm.

On the $Al_{0.10}Ga_{0.90}N$ low-temperature buffer layer 101, the GaN-based Group III nitride semiconductor layers 102 to 108 identified in the following items (a) to (g) were grown by the MOCVD technique to complete the stacked structure 10 according to this invention.

(a) An Si-doped n-type GaN layer 102 (carrier concentration (n)=$1\times10^{18}$ cm$^{-3}$, layer thickness (t)=5500 nm)

(b) A superlattice structure layer 103 formed of a 12-ply Si-doped n-type gallium indium nitride mixed crystal ($Ga_{0.98}In_{0.02}N$) layer (t=1.5 nm) and a 11-ply Si-doped n-type gallium indium nitride mixed crystal ($Ga_{0.99}In_{0.01}N$) layer (t=1.5 nm)

(c) A quantum well structure layer 104 formed of an 8-ply n-type GaN (t=15 nm) layer and a 7-ply n-type $Ga_{0.95}In_{0.05}N$ layer (t=2.0 nm)

(d) A high resistance layer 105 formed of $Al_{0.25}Ga_{0.75}N$ (t=1.5 nm)

(e) A superlattice structure layer 106 formed of a 3-ply $Al_{0.10}Ga_{0.90}N$ mixed crystal layer (t=1.5 nm) and a 4-ply $Al_{0.10}Ga_{0.88}In_{0.02}N$ mixed crystal layer (t=1.5 nm)

(f) A p-type $Al_{0.10}Ga_{0.90}N$ layer 107 (carrier concentration (p)=$6\times10^{17}$ cm$^{-3}$, t=2.0 nm)

(g) A p-type $Al_{0.05}Ga_{0.95}N$ layer 108 (carrier concentration (p)=$9\times10^{17}$ cm$^{-3}$, t=350 nm)

The Group III nitride semiconductor layers enumerated in the foregoing items (a) to (g) were sequentially stacked and grown on the low-temperature buffer layer 101 provided with the $Al_{0.10}Ga_{0.90}N$ single crystal layer 101a as an under layer and, therefore, were invariably turned into single crystal layers. The observation by the section TEM technique detected virtually no discernible sign of the presence of an amorphous body in the junction phase boundary between the $Al_{0.10}Ga_{0.90}N$ low-temperature buffer layer 101 and the n-type GaN layer 102 grown at a higher temperature of 1080° C. From this fact, it was inferred that the amorphous body scattered on the first surface of the $Al_{0.10}Ga_{0.90}N$ single crystal layer 101a forming the low-temperature buffer layer 101 in the as-grown state was crystallized when the n-type GaN layer 102 was deposited at the high temperature (1080° C.). Since the Group III nitride semiconductor layers 102 to 108 were stacked on the low-temperature buffer layer 101 containing the $Al_{0.10}Ga_{0.90}N$ single crystal layer 101a oriented in a uniform direction, they were invariably turned into hexagonal single crystal layers having the [10-10] directions thereof oriented in parallel with the [21-10] direction of the sapphire of the substrate 100. Thus, the stacked structure 10 consequently perfected was provided with the GaN-based Group III nitride semiconductor single crystal layers 102 to 108 exhibiting uniform orientation and excelling in the single crystal property.

EXAMPLE 2

This invention will be specifically explained below by citing a case of configuring an LED from the gallium nitride-based semiconductor stacked structure according to this invention.

Figure 4:
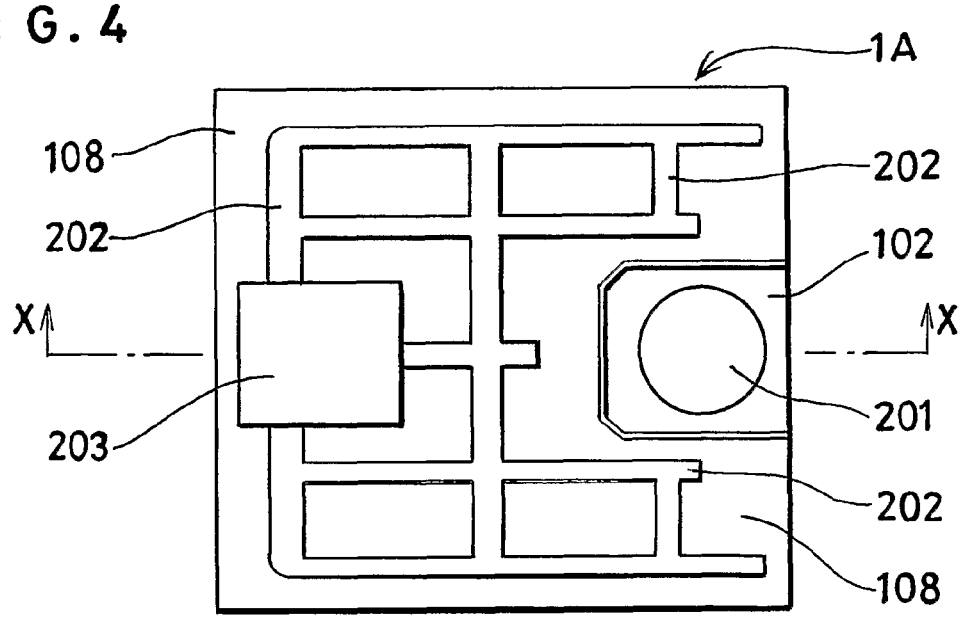
FIG. 4 is a schematic plan view illustrating an LED described in Example 2.
Figure 5:
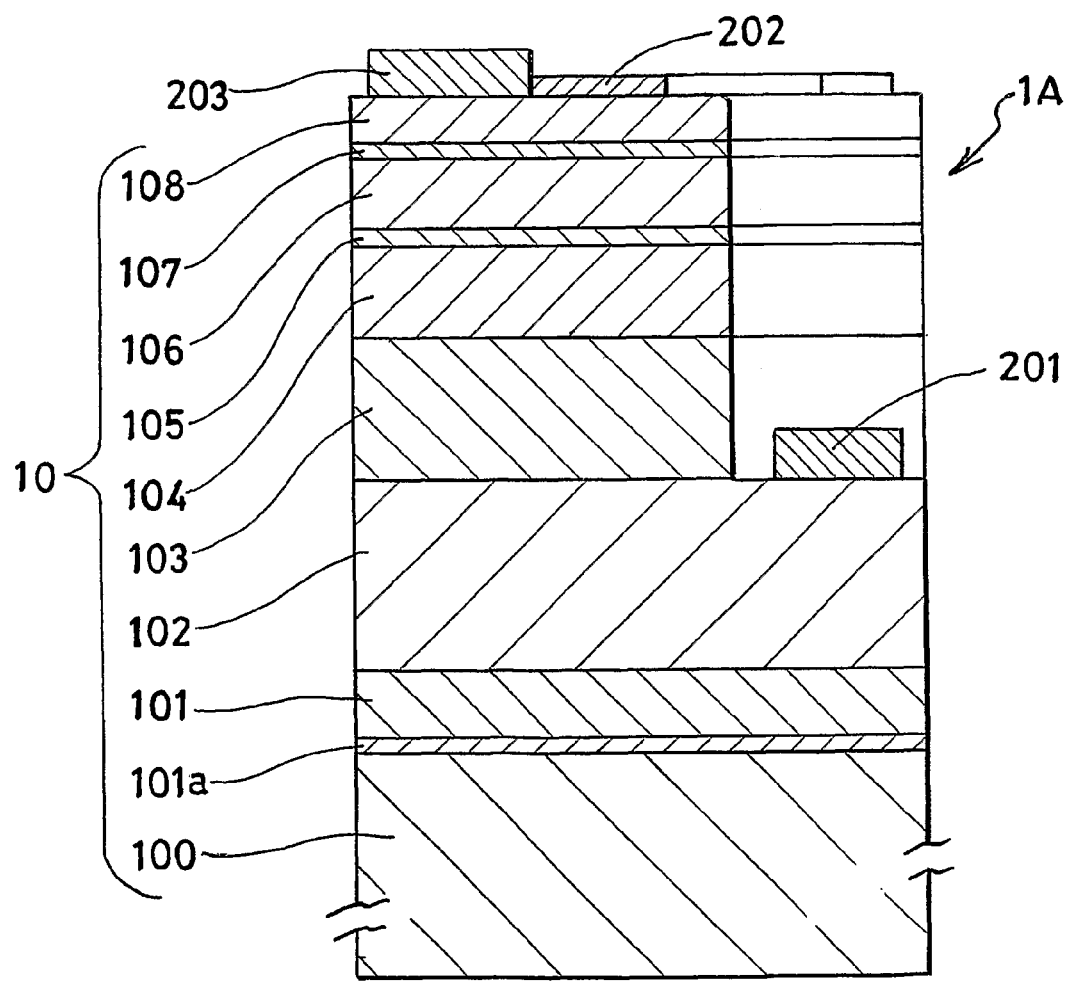
FIG. 5 is a schematic cross-sectional view illustrating the profile taken through the LED shown in FIG. 4 along line V-V.

The plan view of an LED 1A of Example 2 fabricated by using the stacked structure 10 described in Example 1 is schematically illustrated in FIG. 4. FIG. 5 illustrates the profile of the LED 1A. In FIG. 4 and FIG. 5, the same component elements shown in FIG. 3 are denoted by the same reference numerals.

The stacked structure 10 described in Example 1 was worked by the plasma etching means in popular use to expose the surface of the n-type GaN layer 102 disposed through the $Al_{0.10}Ga_{0.90}N$ low-temperature buffer layer 101 exclusively in the region destined to form an n-type ohmic electrode 201. Then, a tungsten (W) film was formed on the exposed surface of the n-type GaN layer 102, and the n-type ohmic electrode 201 containing a structure having an aluminum (Al) film stacked thereon was deposited on the tungsten (W) film. Meantime, on the surface of the p-type $Al_{0.05}Ga_{0.95}N$ layer 108 constituting itself the surface of the stacked structure 10, a p-type ohmic electrode 202 produced by disposing after the fashion of a latticework a film resulting from stacking a gold (Au)-gallium (Ga)-nickel (Ni) alloy film and a nickel oxide film was formed. In part of the p-type ohmic electrode 202, a pad electrode 203 having the bottom part formed of nickel (Ni) and the upper part formed of a gold (Au)-titanium (Ti) alloy film was disposed as electrically conducted to the p-type ohmic electrode 202.

Consequently, the LED 1A of the p-n junction-type double hetero (DH) structure having the n-type GaN layer 102 described in Example 1 as the n-type clad layer, the quantum well structure layer 104 formed of GaN layer/n-type $Ga_{0.95}In_{0.05}N$ layer as the light-emitting layer, and the uppermost p-type $Al_{0.05}Ga_{0.95}N$ layer 108 as the p-type contact layer was fabricated.

When a device operating current of 20 mA was flown in the forward direction between the n-type and p-type ohmic electrodes 201 and 202, the LED 1A emitted a blue light having a central wavelength of 450 nm. The emission intensity measured in the state of chip prior to being molded with a resin by using an ordinary integrating sphere reached about 5 milliwatt (mW). The forward direction voltage (Vf) reached a low value of 3.3 V. The n-type ohmic electrode 201 and the p-type ohmic electrode 202 were both formed through an $Al_{0.10}Ga_{0.90}N$ low-temperature buffer layer 101 provided in the as-grown state with an $Al_{0.10}Ga_{0.90}N$ low-temperature buffer layer 101 having a uniform orientation. Since they were so constructed as to be disposed on the Group III nitride semiconductor layer excelling in crystallinity, they were enabled to suppress local breakdown voltage. Thus, the reverse voltage obtained when the reverse current was set at 10 μA reached a high value exceeding 15 V.

EXAMPLE 3

This invention will be specifically described by citing a case of fabricating an LED from a gallium nitride-based semiconductor stacked structure formed in accordance with this invention.

A gallium nitride-based stacked structure was formed by faithfully following the procedure of Example 1 while forming a low-temperature buffer layer of gallium nitride (GaN), a substance different from the counterpart of Example 1. The GaN low-temperature buffer layer was formed by the normal pressure (approximating the atmospheric pressure) MOCVD technique at 350° C. using $(CH_3)_3Ga$ and $NH_3$ as the raw materials. The total thickness of the GaN layer constituting the low-temperature buffer layer was set at 15 nm.

As a result of the investigation performed by the ordinary electron beam diffraction technique, the presence of a single crystal layer of hexagonal GaN having the [10-10] direction thereof laid in parallel with the [21-10] direction of sapphire already in the as-grown state in the region contiguous to the sapphire substrate of the low-temperature buffer layer was confirmed. This GaN single crystal layer existed in such a manner as to cover substantially the whole of the first (0001) face of the sapphire forming the substrate. The electron beam diffraction pattern showed that the aforementioned orientation was uniformly retained despite difference in region. It was further found that an amorphous body was scattered approximately in the form of spheres having a circular cross section on the (0001) face of the GaN single crystal layer.

Virtually no amorphous body was detected on the GaN low-temperature buffer layer after the component layers of the stacked structure had been formed thereon. This fact supports an inference that the amorphous body was crystallized during the formation of the component layers on the GaN low-temperature buffer layer at a high temperature.

The stacked structure mentioned above was subjected to an etching work in the manner described in Example 2 and then provided with n-type and p-type ohmic electrodes disposed and formed in the same manner as in Example 2. An LED fabricated in the same manner as in Example 2 emitted a light having a central wavelength of 450 nm and bearing a blue color when the forward direction current was set at 20 mA. The emission intensity measured by using an ordinary integrating sphere while in the chip state prior to being molded with resin reached about 5 milliwatt (mW). The forward direction voltage (Vf) reached a low value of 3.3 V. Since the n-type and p-type ohmic electrodes were both disposed on the GaN-based single crystal layer enabled by the GaN low-temperature buffer layer formed of the crystal structure contemplated by this invention to acquire uniform orientation, the LED consequently obtained was able to suppress local inferior breakdown voltage.

An $Al_{0.10}Ga_{0.90}N$ low-temperature buffer layer formed by containing gallium predominantly over aluminum and allowing trimethyl aluminum as an aluminum source to reach the (0001) face of the sapphire substrate before triethyl gallium as a gallium source was grown by the MOCVD technique. A polycrystalline layer that contains a hexagonal crystal having the [21-10] direction therefor oriented in parallel with the [21-10] direction of sapphire existed in the junction region of the low-temperature buffer layer and the sapphire substrate. An LED was fabricated by stacking the same semiconductor layers 102 to 108 as used in Example 1 on the low-temperature buffer layer and subjecting them together to the procedure of Example 2. While this LED emitted a blue light having the wavelength described in Example 2, the emission intensity was about 1 mW, which is about ⅕ of the emission intensity of the LED described in Example 2. When the reverse current was flown, the LED incurred local breakdown frequently and, as a result, suffered the electrical breakdown to reach a low value of about 5 V (@ 10 μA), and revealed absence of a breakdown voltage property.

INDUSTRIAL APPLICABILITY

The gallium nitride-based semiconductor device according to the present invention comprises a gallium nitride-based semiconductor layer as an upper layer having a specific orientation, suffering crystal defects only at a low density and excelling in crystallinity and a buffer layer as an under layer. From the gallium nitride-based semiconductor layer, therefore, it is made possible to provide a light-emitting diode which betrays inferior breakdown voltage meagerly in the reverse direction and exhibits an excellent breakdown voltage property.

The invention claimed is:

1. A gallium nitride-based semiconductor stacked structure comprising:
    a single crystal substrate;
    a low-temperature buffer layer grown at a low temperature in a region contiguous to the single crystal substrate; and
    a gallium nitride-based semiconductor layer overlying the low-temperature buffer layer;
    wherein the low-temperature buffer layer possesses therein a single crystal layer formed of a hexagonal $Al_xGa_yN$-based Group III nitride material containing gallium predominantly over aluminum, in which $0.5<y\leq1$, $X+y=1$, and the single crystal layer has crystal defects at a smaller density on a (10-10) crystal face than on a (11-20) crystal face.

2. A gallium nitride-based semiconductor stacked structure according to claim 1, wherein the single crystal substrate is a sapphire (α-alumina single crystal) substrate having a {0001} face (C plane) surface thereof.

3. A gallium nitride-based semiconductor stacked structure according to claim 1, wherein the single crystal substrate is a silicon carbide substrate having a {0001} face (C plane) surface thereof.

4. A gallium nitride-based semiconductor stacked structure according to claim 1, wherein the gallium nitride-based semiconductor layer has a [10-10] direction thereof laid in parallel to a [10-10] direction of the single crystal layer of the low-temperature buffer layer.

5. A gallium nitride-based semiconductor stacked structure according to claim 1, wherein the single crystal layer of the low-temperature buffer layer has crystal defects on a (10-10) crystal face at a density of ⅕ or less of a density of crystal defects on a (11-20) crystal face.

6. A method for the production of a gallium nitride-based semiconductor stacked structure, comprising the steps of:
    forming on a single crystal substrate a low-temperature buffer layer grown at a low temperature falling in a range of 250° C. to 500° C.;
    forming a gallium nitride-based semiconductor layer on the low-temperature buffer layer; and
    forming in the low-temperature buffer layer a single crystal layer made of a hexagonal $Al_xGa_yN$-based Group III nitride material containing gallium predominantly over aluminum, in which $0.5<y\leq1$, $X+y=1$, by causing gallium raw material to reach a surface of the substrate before aluminum raw material;
    wherein the single crystal layer has crystal defects on a (10-10) crystal face at a lower density than on a (11-20) crystal face.

7. A method according to claim 6, wherein the single crystal substrate is a sapphire (α-alumina single crystal) substrate having a {0001} face (C plane) surface thereof.

8. A method according to claim 6, wherein the single crystal substrate is a silicon carbide substrate having a {0001} face (C plane) surface thereof.

9. A method according to claim 6, wherein the growth rate of the low-temperature buffer layer is grown at a growth rate in a range of 1 to 3 nm/min.

10. A gallium nitride-based semiconductor device using the gallium nitride-based semiconductor stacked structure according to claim 1.

11. A lamp using the gallium nitride-based semiconductor device according to claim 10.

* * * * *